US007061823B2

(12) United States Patent
Faue et al.

(10) Patent No.: US 7,061,823 B2
(45) Date of Patent: Jun. 13, 2006

(54) LIMITED OUTPUT ADDRESS REGISTER TECHNIQUE PROVIDING SELECTIVELY VARIABLE WRITE LATENCY IN DDR2 (DOUBLE DATA RATE TWO) INTEGRATED CIRCUIT MEMORY DEVICES

(75) Inventors: Jon Allan Faue, Colorado Springs, CO (US); Steve S. Eaton, San Jose, CA (US)

(73) Assignee: ProMOS Technologies Inc., Hsinchu (TW)

( * ) Notice: Subject to any disclaimer, the term of this patent is extended or adjusted under 35 U.S.C. 154(b) by 17 days.

(21) Appl. No.: 10/924,546

(22) Filed: Aug. 24, 2004

(65) Prior Publication Data

US 2006/0044925 A1  Mar. 2, 2006

(51) Int. Cl.
*G11C 8/00* (2006.01)
(52) U.S. Cl. .................................. 365/230.08; 365/233
(58) Field of Classification Search ...................... None
See application file for complete search history.

(56) References Cited

U.S. PATENT DOCUMENTS

| | | | | |
|---|---|---|---|---|
| 5,062,080 | A | * 10/1991 | Goldsmith | ............. 365/230.01 |
| 6,166,970 | A | * 12/2000 | Yun | ............................. 365/191 |
| 6,804,970 | B1 | * 10/2004 | Saeki et al. | .................... 62/133 |
| 2005/0138456 | A1 | * 6/2005 | Song | .......................... 713/400 |

FOREIGN PATENT DOCUMENTS

JP  2004-253123  * 9/2004

OTHER PUBLICATIONS

Jedec Standard, DDR2 SDRAM Specification, JESD79-2A, JEDEC Solid State Technology Association, Jan. 2004, pp. i-viii, 1-75.
Davis, Brian, Mudge, Trevor, Jacob, Bruce, Cuppu, Vinodh, DDR2 and Low Latency Variants, Electrical Engineering & Computer Science, University of Michigan, Electrical & Computer Engineering, University of Maryland, pp. 1-15.

* cited by examiner

*Primary Examiner*—Tan T. Nguyen
(74) *Attorney, Agent, or Firm*—William J. Kubida; Hogan & Hartson LLP

(57) ABSTRACT

A limited output address register technique for selectively variable write latency in double data rate 2 (DDR2) integrated circuit memory devices providing a reduced number of paths directly connected to the output. A chain of DQ flip-flops is disclosed which is only loaded on valid write address commands but shifts continually thereafter every clock cycle. Since new READ or WRITE commands cannot be issued on successive cycles, at any given point in the chain an address (or state) is valid for at least two cycles. Therefore, a selected point in the register chain can be used to satisfy the requirements for two different latencies. For DDR2, having N write latency cases, only ceil(N/2) access points to the write address output have to be provided thereby saving on-chip area and increasing speed. In a specific embodiment disclosed, DDR1 may also be supported.

23 Claims, 5 Drawing Sheets

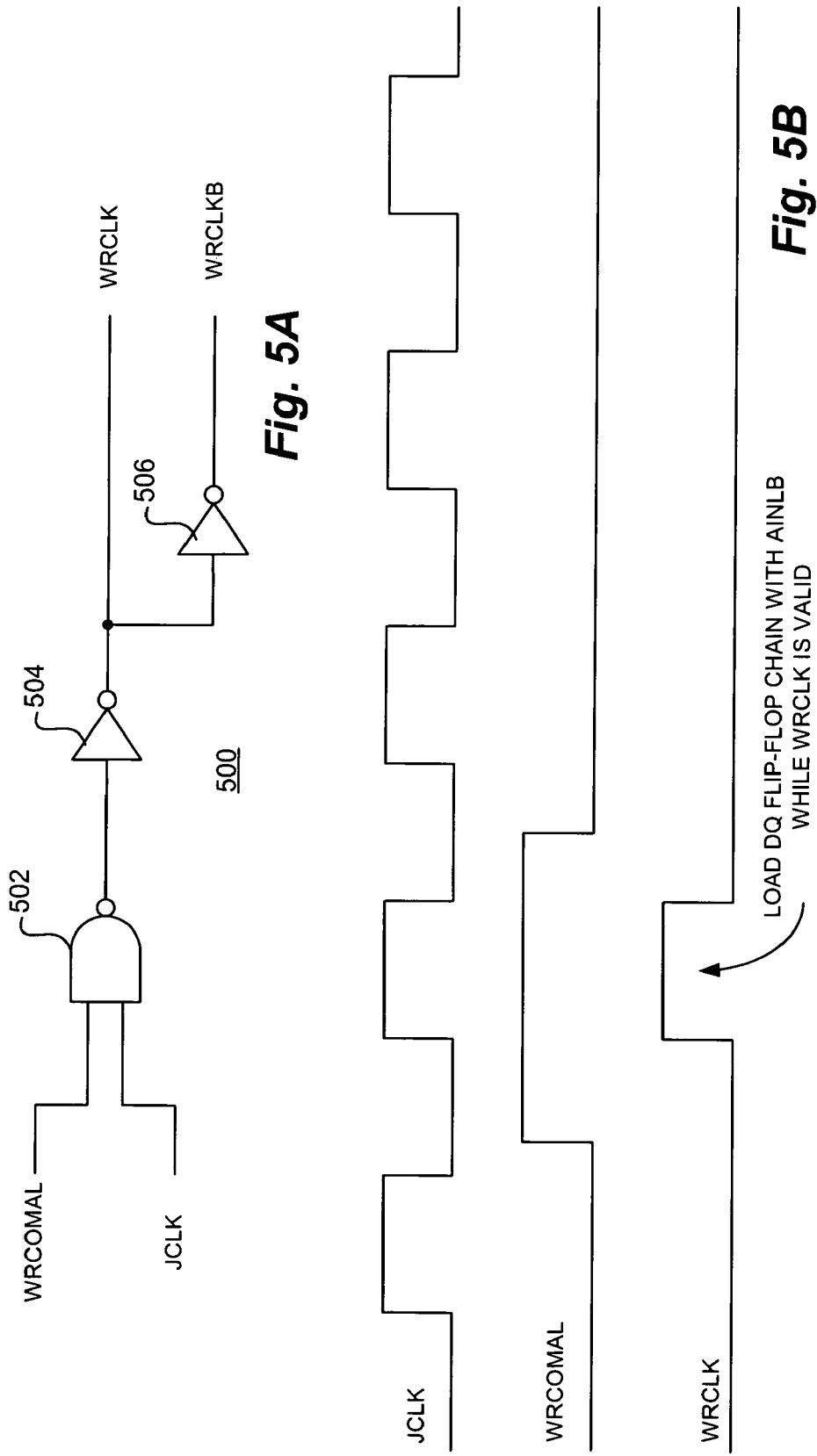

US 7,061,823 B2

LIMITED OUTPUT ADDRESS REGISTER TECHNIQUE PROVIDING SELECTIVELY VARIABLE WRITE LATENCY IN DDR2 (DOUBLE DATA RATE TWO) INTEGRATED CIRCUIT MEMORY DEVICES

BACKGROUND OF THE INVENTION

The present invention relates, in general, to the field of integrated circuit (IC) memory devices. More particularly, the present invention relates to a limited output address register technique providing selectively variable write latency in double data rate 2 (DDR2) integrated circuit memory devices.

DDR2 is a recently defined JEDEC (Joint Electronic Device Engineering Council) memory standard published in January, 2004 as JESD79-2A which is a follow on to the DDR1 memory specification. The DDR2 standard specifies a number of improvements over that of the DDR1 standard which serve to make the new memory types more efficient, both at transferring data and at saving power. In addition to built in On Die Termination (ODT), posted column address strobe (CAS) and additive latency (AL) features are two new features which enable the memory to run faster and more efficiently.

With posted CAS and additive latency, a READ or WRITE command can be issued immediately after the ACTIVATE command, then this READ/WRITE command is delayed internally by a predetermined number of clock cycles (hence additive latency) before being executed.

The JEDEC definition of DDR2 allows for CAS latencies of 3, 4 or 5, as compared to DDR1's 1.5, 2 and 2.5. Write latency is also considerably greater with DDR2. While DDR1 allows a single cycle for write latency, DDR2 defines write latency as equal to the read latency minus one (WL=RL−1), where the read latency is equal to the additive latency (AL) plus the /CAS latency (CL) (or RL=AL+CL). This provides a time profile for both READ and WRITE transactions that enables easier pipelining of the two transaction types, and thus higher bus utilization.

SUMMARY OF THE INVENTION

Disclosed herein is a limited output address register technique for selectively variable write latency in double data rate 2 (DDR2) integrated circuit memory devices providing a reduced number of paths directly connected to the output. The present invention serves to reduce capacitance at the output (thereby increasing device speed) and also saves on the area needed for completing the signal wire-up.

In accordance with an exemplary embodiment disclosed herein, a chain of DQ flip-flops is provided which is only loaded on valid write address commands but shifts continually thereafter every clock cycle. Since new READ or WRITE commands cannot be issued on successive cycles, at any given point in the chain an address (or state) is valid for at least two cycles. Therefore, a selected point in the register chain can be used to satisfy the requirements for two different latencies. For DDR2, having N write latency cases, only ceil(N/2) access points to the write address output have to be provided thereby saving on-chip area and increasing speed (ceil<x> is a ceiling function defined as giving the smallest integer greater than or equal to x). In accordance with a particular representative embodiment of the present invention disclosed herein, DDR1 is also supported through the provision of a single extra access point to support that case. Effectively, the present invention utilizes three paths to support a total of five cases, four DDR2 and one DDR1.

Particularly disclosed herein is an integrated circuit device having a memory array and including an address register providing selective write latency for the memory array. The device comprises a plurality of flip-flops serially coupled between an address input and write address output, with each of the plurality of flip-flops presenting an output node thereof with at least one of the plurality of flip-flops being operative in response to a write clocking signal and at least others of the plurality of flip-flops being operative in response to another clocking signal.

Also particularly disclosed herein is a method for providing selective write latency for a memory array in an integrated circuit device. The method comprises providing a series chain of flip-flops coupled between a write address input and a write address output with each one of the chain of flip-flops having an output node thereof. Address information is loaded to the write address input in response to a clock signal corresponding to a write command of the memory array and predetermined ones of the output nodes are selectively coupled to the write address output.

Further particularly disclosed herein is an integrated circuit device having a memory array and including an address register providing selective write latency for the memory array. The device comprises a serial chain of flip-flops coupled between a write address input and a write address output for providing N write latency conditions and M signal paths coupling the serial chain of flip-flops to the write address output, where M<N. In a particular embodiment disclosed herein, M=ceil(N/2) and, where both DDR1 and DDR2 write latencies are supported, M=ceil(N/2)+1.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 5A is a schematic diagram of a representative circuit for deriving the complementary WRCLK and WRCLKB signals from a write command adjusted for additive latency (WRCOMAL) signal and the main internal chip clock (JCLK); and FIG. 5B are representative timing diagrams for the circuit of the preceding figure illustrating the interrelationship among the signals illustrated in the preceding figure.

DESCRIPTION OF A REPRESENTATIVE EMBODIMENT

Figure 1:
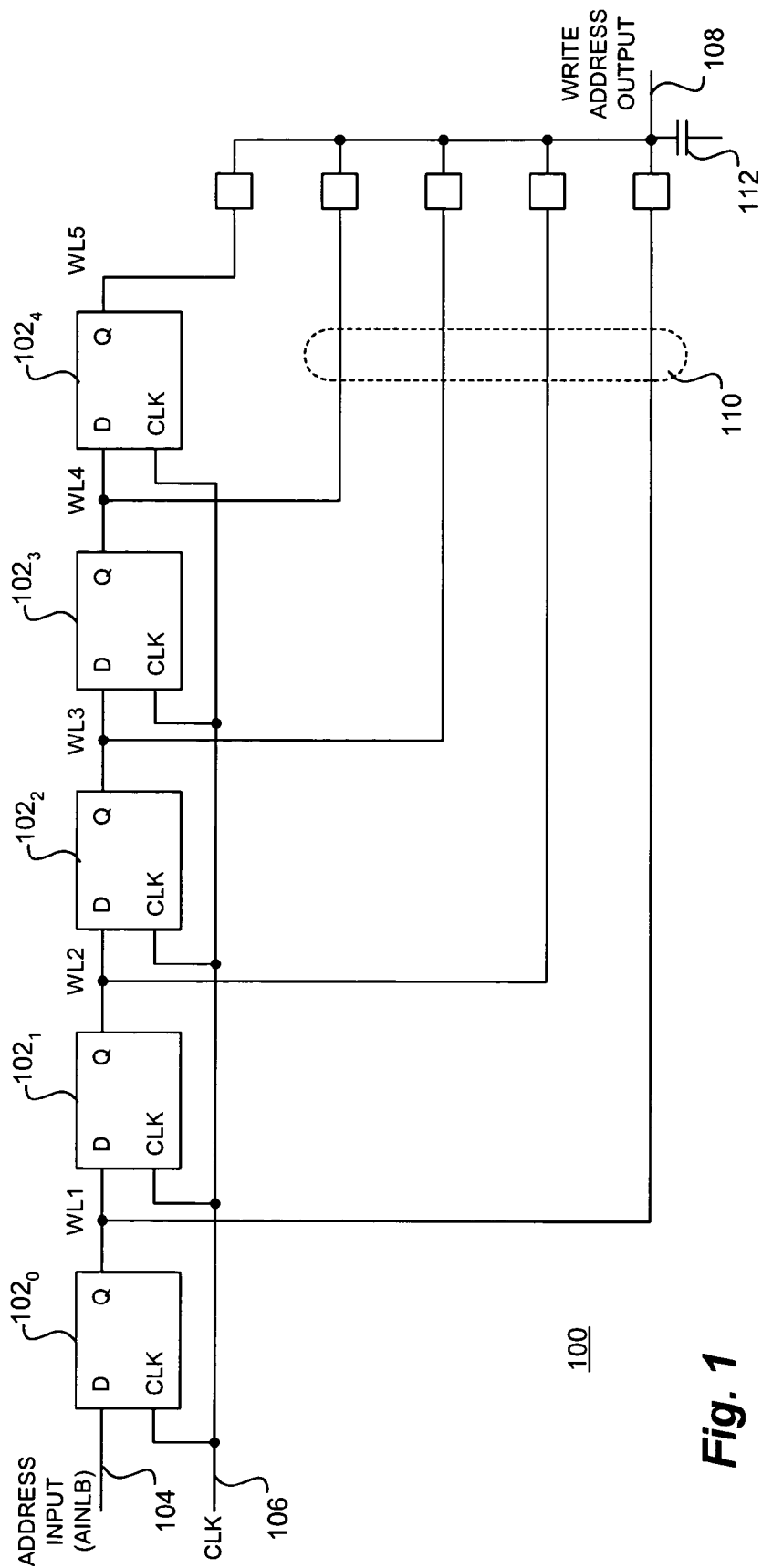
FIG. 1 is a conceptual implementation of a clocked DQ flip-flop delay chain utilizing five separate multiplexers to the write address output and this design would result in the need for as many signal paths and concomitantly excessive loading on the address output.

With reference now to FIG. 1, a conceptual implementation of a clocked DQ flip-flop delay chain 100 is shown for providing a selective write latency function. The delay chain 100 incorporates five DQ flip-flops $102_0$ through $102_4$ concatenated together and coupled to a write address input 104. The DQ flip-flops $102_0$ through $102_4$ are clocked by a common clocking signal (CLK) on line 106 and the outputs of each of the DQ flip-flops $102_0$ through $102_4$ are separately coupled to a write address output line 108.

Utilizing this design, a large number of multiplexer signal paths 110 must be routed to the write address output 108 resulting in a relatively large amount of on-chip area required. Also, since the entire chain is controlled by the CLK signal on line 106, it is continually loading address data into the chain and constantly shifting with no regard as to whether there are WRITE operations are not. Moreover, excessive loading due to parasitic capacitance (indicated by capacitor 112) induced by the multiplexers would also be imposed upon the write address output 108 through the use of such a design.

Another conceivable implementation would be to design a minimal register circuit, but control it with separate clocking signals, not a global clock, such that the write address output was always valid at the proper time for a given write latency case. This method would, however, also provide difficulties due to relatively large number of tracks required for routing the different clock lines needed.

Figure 2:
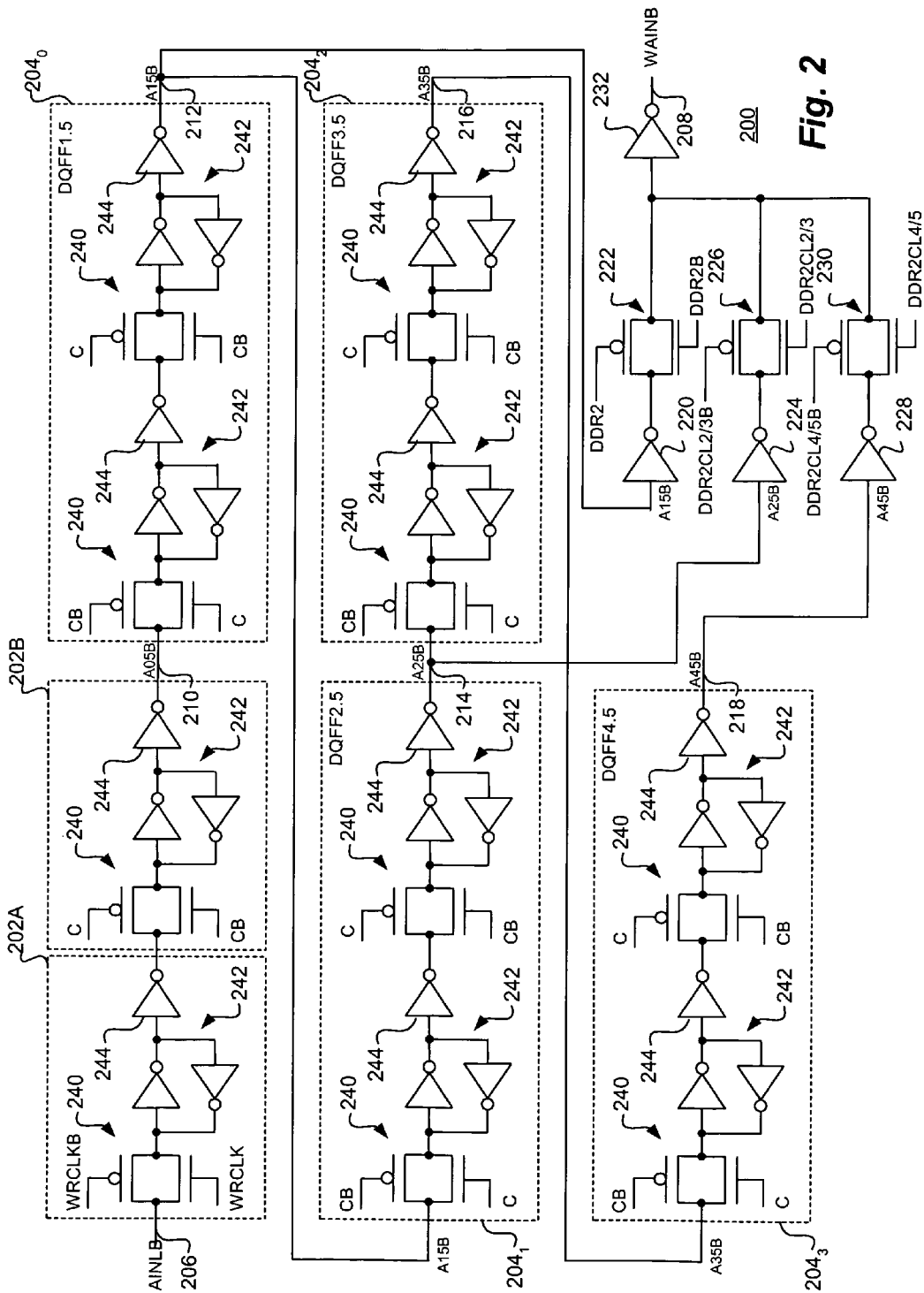
FIG. 2 is a representative embodiment of a write address shift chain implemented in accordance with the technique of the present invention in which the chain of DQ flip-flops is loaded only when a new valid write address is required and requiring only three separate multiplexer paths instead of the five shown in the preceding figure.

With reference additionally now to FIG. 2, a representative embodiment of a write address shift chain 200 is shown as implemented in accordance with the technique of the present invention in which the chain of DQ flip-flops 202A, 202B and $204_0$ through $204_3$ is, significantly, loaded only when a new valid write address is required and needing only three separate multiplexer paths instead of the five shown in the preceding figure. In conjunction with this and the succeeding figures, the following defined terms pertain:

Write Latency—After the submission of a WRITE command (and the address with it), the corresponding data is supplied N cycles later where N is equal to the write latency. The actual internal writing of the data to its assigned address actually takes place at some point after that.

JCLK—The main internal chip clock (clk) having a frequency the same as that of the external clock but $T_{ch}$ (clock high time) is limited to a maximum width. The clock (C) and complementary clock bar (CB) signals illustrated are derived from JCLK.

AINLB—Address Input Latent Bar. The input of the write address DQ flip-flop, any additive latency is already accounted for in this address information.

WAINB—Write Address Input Bar. The output of the write address DQ flip-flop chain that is actually used by the column address path to execute the WRITE command.

WRCLK—Write Clock. The clock that fires corresponding to a WRITE command that loads the write address DQ flip-flop chain, together with the complementary signal Write Clock bar (WCLKB).

WAC—Write Address Capture clock. The clock that is used to capture the WAINB output of the DQ flip-flop chain and pass it to the column path for WRITE execution. The WAINB address data should be synchronized with the WAC clock for proper operation.

The write address shift chain 200 illustrated comprises a first flip-flop portion (or shift register) 202A which is coupled to an AINLB input 206 and is clocked by the WRCLK and complementary WRCLKB signals as illustrated. The output of the flip-flop portion 202A is coupled to the input of another flip-flop portion 202B which is clocked by the C and CB signals and has its output (A05B) on line 210 coupled to the input of a subsequent DQ flip-flop $204_0$. The output of the DQ flip-flop $204_0$ (A15B) on line 212 is coupled, in turn, to the input of a next DQ flip-flop $204_1$, which also has its output (A25B) on line 214 coupled to the input of yet another DQ flip-flop $204_2$. The output of the DQ flip-flop $204_2$ (A35B) on line 216 is coupled to the input of a final DQ flip-flop $204_3$ which has as its output a signal (A45B) on line 218.

The A15B signal on line 212 is supplied to the input of an inverter 220 which has its output coupled to the input of a complementary metal oxide semiconductor (CMOS) pass gate 222 which is controlled by complementary DDR2 and DDR2B signals as shown. Similarly, the A25B signal on line 214 is supplied to the input of a similar inverter 224 which has its output coupled to the input of a CMOS pass gate 226 which is controlled by complementary DDR2CL2/3 and DDR2CL2/3B signals as illustrated. In like manner, the A45B signal on line 218 is supplied to the input of an inverter 228 which has its output coupled to the input of a CMOS pass gate 230 which is controlled by complementary DDR2CL4/5 and DDR2CL4/5B signals. The outputs of the CMOS pass gates 222, 226 and 230 are coupled to the input of an additional inverter 232 which has its output coupled to the WAINB output on line 208.

In the particular implementation of the present invention shown, each of the flip-flops portions 202A, 202B and flip-flops $204_0$ through $204_3$ comprise a CMOS pass gate 240 (in the case of flip-flop portion 202A clocked by WRCLK and WRCLKB signals, otherwise by the C and CB signals) which has its output coupled to a latch 242 comprising a pair of cross-coupled inverters. The output of the latch 242 is then coupled to the input of an inverter 244 substantially as shown.

In operation, a flip-flop functions to transfer the value at its input to its output on the rising edge of a clock signal, holding the value at all other times. Stated another way, the signal through a flip-flop propagates only when clocked. The DQ flip-flops $204_0$ through $204_3$ comprise master and slave latch pairs as shown. Functionally, the write address shift chain 200 is loaded (or initiated) only when a valid write address is needed. Since the DDR2 specification dictates that new WRITE commands can only be issued every other cycle, all necessary write address combinations (latent delays) can be achieved utilizing only three separate multiplexer paths, and not five.

As noted previously for DDR2 devices, the write latency (WL) is equal to the read latency (RL) minus 1 (or WL=RL−1) where the read latency is defined as the additive latency (AL) plus the /CAS latency (CL). Therefore, with no additive latency, read latency (RL) is equal to the /CAS latency (CL) and WL=CL−1). For DDR2 devices, to support WL=n, then only ceil(n/2) paths to the valid write address output need be provided. To support both DDR1 and DDR2, ceil(n/2)+1 paths may be provided as in the particular embodiment of the present invention illustrated, wherein for the DDR2 valid CL case=2, 3, 4, 5. Therefore WL=1, 2, 3, 4 and n=4, 4/2=2. For support of the DDR1 case as well, an additional path is provided such that 2+1=3 paths are utilized as in the particular embodiment disclosed. It should be noted that for DDR1, WL=1 is not the same as that for DDR2 WL=1 in that addresses are delayed an extra cycle in the DDR2 case.

Also as illustrated, the internal clk=0 phase is used to shift the DQ flip-flop address information. Write addresses are eventually captured and executed by a true phase clock (clk=1), so by using clk=0 as the primary shifter, at least a ½ tck set up time is provided. The write address shift chain 200 is initially loaded with a clk=1 phase "load command" timed for the proper sequence of write operations. Relative to when the user actually issued the write command, this moves dependent upon the additive latency that was chosen. With respect to the particular embodiment of the write address shift chain 200 disclosed, it can be seen that the WRCLK signal loads the first element of the chain 200 with all other elements being clocked by a derivative of the normal chip clock. The Write Address Input bar (WAINB) signal on line 208 has three potential paths from the shift chain 200 which covers the five possible write latency cases in this design.

Figure 3:
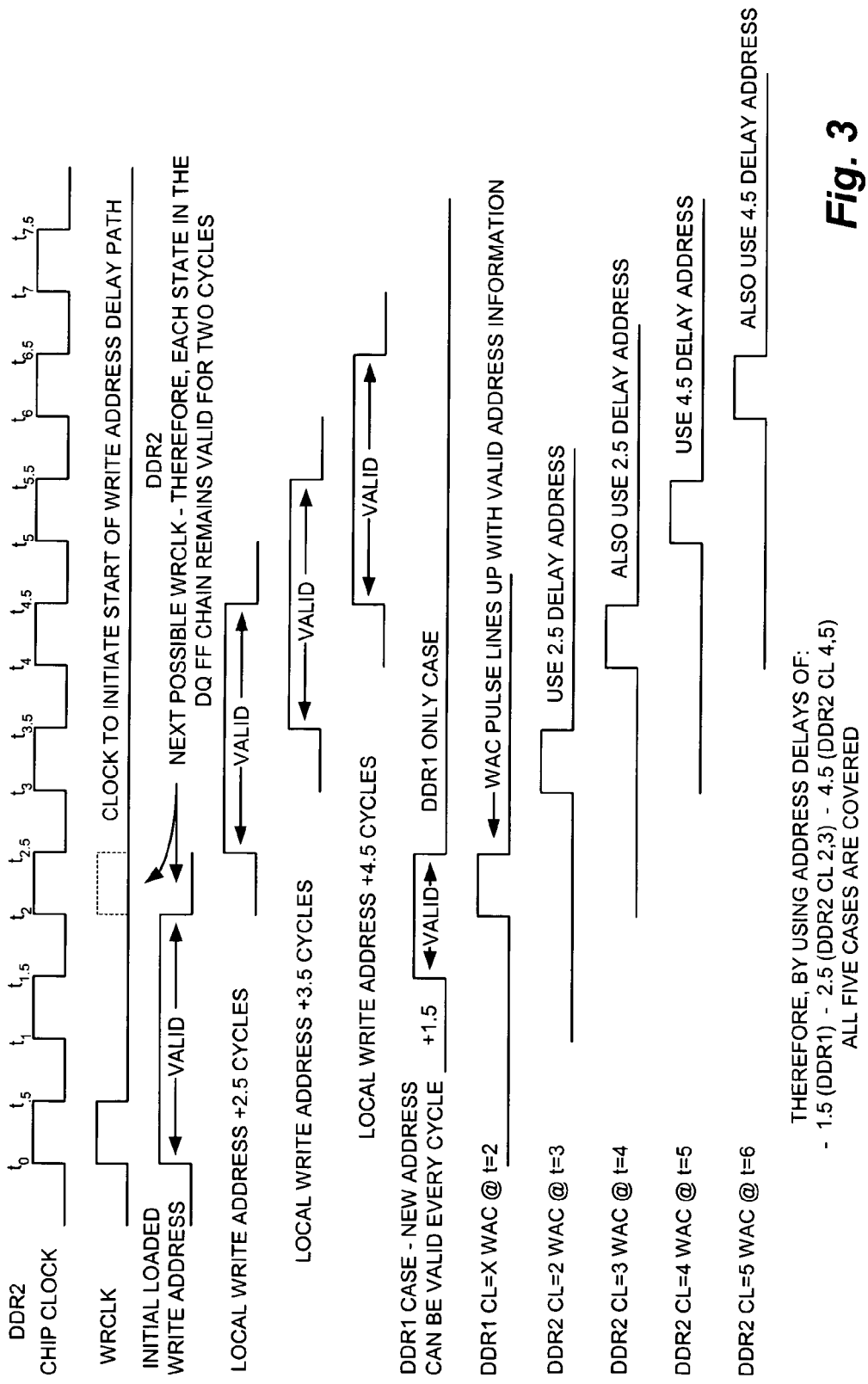
FIG. 3 is a timing diagram for the representative implementation of the present invention illustrated in the preceding figure showing how address delays of 1.5, 2.5 and 4.5 are utilized to cover all five cases required.

With reference additionally now to FIG. 3, a timing diagram for the representative implementation of the present invention illustrated in the preceding figure is shown depicting how address delays of 1.5, 2.5 and 4.5 are utilized to cover all five cases specified. The WRCLK signal fires and loads the write address shift chain 200 at the right point in time. From then on the addresses shift through in the same manner as addresses of the write latency (WL) chosen. Only a single output multiplexer is enabled so that the address with the proper delay is captured by the WAC (write address capture) clock.

Figure 4:
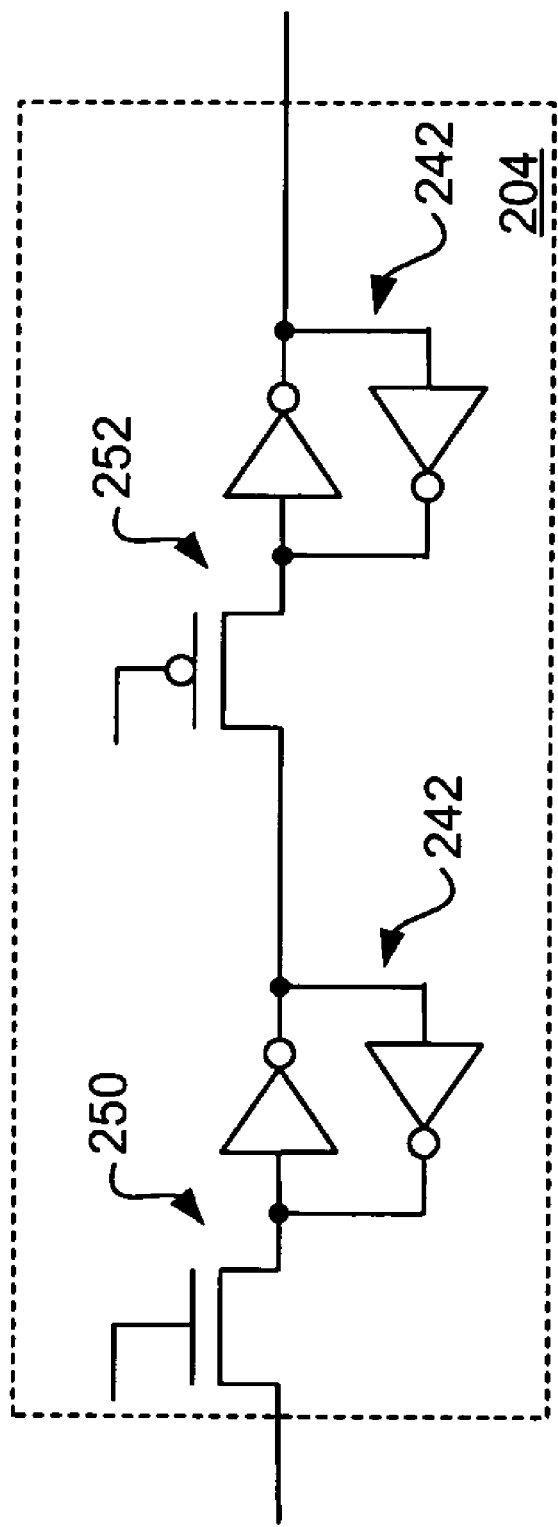
FIG. 4 illustrates a possible alternative implementation of a DQ flip-flop which may be used in a write address shift chain in accordance with the present invention.

With reference additionally now to FIG. 4, an alternative embodiment for the DQ flip-flops 204 illustrated previously is shown. In this embodiment, a single N-channel transistor 250 and P-channel transistor 252 may be substituted for the CMOS pass gates 240 (FIG. 2) and used in conjunction with latches 242. The transistors 250 and 252 may then be gated with the C clock signal alone.

With reference additionally now to FIG. 5A, a schematic diagram of a representative circuit 500 is shown for deriving the complementary WRCLK and WRCLKB signals from a write command adjusted for additive latency (WRCOMAL) signal and the main internal chip clock (JCLK). The circuit 500 comprises, in pertinent part, a logic NAND gate 502 receiving as inputs the WRCOMAL and JCLK signals. When both signals are active, the NAND gate 502 provides the WRCLK signal output through inverter 504 as well as the complementary WRCLKB signal at the output of inverter 506.

With reference additionally now to FIG. 5B, representative timing diagrams for the circuit 500 of the preceding figure are shown further illustrating the interrelationship among the WRCOMAL, JCLK and WRCLK signals of the preceding figure. As illustrated, the DQ flip-flop chain previously disclosed is loaded with AINLB while the WRCLK signal is in an "active" state.

While there have been described above the principles of the present invention in conjunction with specific circuit implementations and latency cases, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device having a memory array and including an address register providing selective write latency for said memory array, said device comprising:
a plurality of flip-flops serially coupled between an address input and write address output, each of said plurality of flip-flops presenting an output node thereof with at least one of said plurality of flip-flops being operative in response to a write clocking signal and at least others of said plurality of flip-flops being operative in response to another clocking signal.

2. The integrated circuit device of claim 1 wherein said write clocking signal corresponds to a WRITE command of said memory array.

3. The integrated circuit device of claim 1 wherein said another clocking signal is a derivative of an internal clocking signal of said memory array.

4. The integrated circuit device of claim 1 further comprising:
a number of pass gates, each of said pass gates being coupled to a selected one of said output nodes of said plurality of flip-flops, said pass gates being operative in response to predetermined enable signals for coupling said selected ones of said output nodes to said write address output.

5. The integrated circuit device of claim 4 further comprising a driver coupling an input of each of said number of pass gates to each of said output nodes of said plurality of flip-flops.

6. The integrated circuit device of claim 5 wherein said drivers comprise an inverter.

7. The integrated circuit device of claim 4 further comprising a driver coupling outputs of each of said number of pass gates to said write address output.

8. The integrated circuit device of claim 7 wherein said driver comprises an inverter.

9. The integrated circuit device of claim 1 wherein each of said flip-flops comprise:
at least one pass gate responsive to an applied clocking signal; and
at least one latch coupled to an output of said pass gate.

10. The integrated circuit device of claim 9 wherein said at least one pass gate comprises an MOS transistor.

11. The integrated circuit device of claim 9 wherein said at least one pass gate comprises a CMOS transmission gate.

12. The integrated circuit device of claim 9 wherein said at least one latch comprises a pair of cross-coupled inverters.

13. The integrated circuit device of claim 9 further comprising:
an inverter coupled to an output of said at least one latch.

14. A method for providing selective write latency for a memory array in an integrated circuit device comprising:

provide a series chain of flip-flops coupled between a write address input and a write address output, each one of said chain of flip-flops having an output node thereof;

loading address information to said write address input in response to a clock signal corresponding to a write command of said memory array; and selectively coupling predetermined ones of said output nodes to said write address output.

15. The method of claim 14 wherein said flip-flops are provided as DQ flip-flops.

16. The method of claim 14 wherein said step of loading address information to said write address input occurs only when required for a write operation to said memory array.

17. The method of claim 16 wherein said address information is loaded to a first one of said chain of flip-flops in response to a first clock signal and remaining ones of said chain of flip-flops are operative in response to a second clock signal.

18. The method of claim 17 wherein said second clock signal is a derivative of an internal clock signal of said integrated circuit device.

19. An integrated circuit device having a memory array and including an address register providing selective write latency for said memory array, said device comprising:

a serial chain of flip-flops coupled between a write address input and a write address output for providing N write latency conditions; and M signal paths coupling said serial chain of flip-flops to said write address output, where M=cell(N/2).

20. The integrated circuit device of claim 19 wherein said memory array is substantially JEDEC DDR2 standard compliant.

21. The integrated circuit device of claim 19 wherein said write latency conditions are 1, 2, 3 and 4.

22. The integrated circuit device of claim 19 further comprising:

an additional signal path coupling said serial chain of flip-flops to said write address output.

23. The integrated circuit device of claim 22 wherein said memory array is substantially JEDEC DDR1 and DDR2 compliant.

* * * * *

UNITED STATES PATENT AND TRADEMARK OFFICE
CERTIFICATE OF CORRECTION

| | | |
|---|---|---|
| PATENT NO. | : 7,061,823 B2 | Page 1 of 1 |
| APPLICATION NO. | : 10/924546 | |
| DATED | : June 13, 2006 | |
| INVENTOR(S) | : Jon Allan Faue and Steve S. Eaton | |

It is certified that error appears in the above-identified patent and that said Letters Patent is hereby corrected as shown below:

Column 8, line 8, "cell" should be --ceil--

Signed and Sealed this

Twelfth Day of September, 2006

JON W. DUDAS
*Director of the United States Patent and Trademark Office*